United States Patent
Maheshwari et al.

[11] Patent Number: 5,834,336
[45] Date of Patent: Nov. 10, 1998

[54] BACKSIDE ENCAPSULATION OF TAPE AUTOMATED BONDING DEVICE

[75] Inventors: Abhay Maheshwari, Round Rock; Sunil Thomas, Austin, both of Tex.

[73] Assignee: Texas Instruments Incorporated, Dallas, Tex.

[21] Appl. No.: 614,037

[22] Filed: Mar. 12, 1996

[51] Int. Cl.⁶ .......................... H01L 21/44; H01L 21/48; H01L 21/50
[52] U.S. Cl. .......................... 438/118; 438/119; 438/123; 438/124
[58] Field of Search .................................. 438/111, 118, 438/119, 123

[56] References Cited

U.S. PATENT DOCUMENTS

| | | | |
|---|---|---|---|
| 5,073,521 | 12/1991 | Braden | 437/209 |
| 5,350,811 | 9/1994 | Ichimura et al. | 438/118 |
| 5,409,865 | 4/1995 | Karnezos | 438/118 |
| 5,441,918 | 8/1995 | Morisaki et al. | 438/118 |
| 5,471,027 | 11/1995 | Call et al. | 438/118 |

*Primary Examiner*—John Nielbing
*Assistant Examiner*—David A. Zarneke
*Attorney, Agent, or Firm*—Ronald O. Neerings; James C. Kesterson; Richard L. Donaldson

[57] ABSTRACT

A TAB device (10) is coupled to a circuit board (12). The TAB device (10) includes a semiconductor die (11) having leads (18) extending therefrom. A material layer (30), typically a polyimide layer, covers the inward portion of the leads (18) to maintain leading position during attachment of the TAB device (10) to the circuit board (12). Prior to attachment, a backside encapsulation region (40) is applied to the backside of the TAB device (10), sealing the backside of the leads (18). The backside encapsulation material is selected to have a coefficient of thermal expansion similar to the coefficient of thermal expansion of the first material layer (18). The backside encapsulation material is selected to have a coefficient of thermal expansion similar to the coefficient of thermal expansion of the first material layer (30), to prevent excessive warpage. During attachment, migration of the die attach layer (22) towards the leads will be stopped by the backside encapsulation region (40), preventing the die attach material from shorting the leads (18) of the device (10).

17 Claims, 4 Drawing Sheets

TO HEAT SINK

BACKSIDE ENCAPSULATION OF TAPE AUTOMATED BONDING DEVICE

BACKGROUND OF THE INVENTION

1. Technical Field

This invention relates in general to semiconductor devices and, more particularly, to mounting TAB (Tape Automated Bonding) packaged microchips on a circuit board.

2. Description of the Prior Art

Modern integrated circuits typically use multiple transistors fabricated in a single crystal silicon substrate containing multiple levels of metallization for interconnections. In addition, modern microchips have numerous electrical elements that make up part of the integrated circuit. As electrical current runs through these elements, heat is generated and, consequently, efficient dissipation of the heat becomes a major concern. Thermal management is thus a major design requirement for modern microchips.

Increased miniaturization in the electronic industry has resulted in more and more components being placed on circuit boards in the form of TAB (Tape Automated Bonding) packages. The most general method of attaching the leads of the TAB packages to a printed wiring board (PWB) is to use the "formed lead" process. In this process, the component leads are first excised and formed into a gull-wing shape. Then the leads are attached to the pads on the board using a hot bar or thermocompression bonding method. The leads on the TAB device are formed in such a way to accommodate the thickness of the die attach layer (i.e., material used for contact between the die and the board for heat dissipation and electrical contact) placed between the die and the PWB. Accordingly, the process requires a consistent thickness of the die attach layer for the leads to be formed correctly. Additionally, warpage of the board may result in non-uniform thickness of the die attach layer, with unfavorable consequences.

Another attachment process of a TAB package to a PWB is the "no form process", where the leads of the package are excised, but not formed. In this process, leads act much like cantilever beams which are bent down using a hot bar. The thickness of the die attach layer is less critical in this method since the cantilever-shaped leads are bent down during the bonding process and allows for larger tolerance in die attach layer thickness.

One use for the die attach material is to provide an electrical connection between the die and the PWB, typically for grounding purposes. Electrically conductive die attach materials are usually silver filled polymers; they also function as the thermal path for heat dissipation. Since TAB devices are not encapsulated at the backside of the components, and thus have the leads exposed, any migration of the silver, or other conductive material, to the inner leads during attachment will result in shorting between leads. To avoid migration of the die attach along the sides of the die, the conductive die attach layer is cut to an area smaller than the die itself, to restrict the material from migrating to the edge of the die. A smaller area of die attach can have severe consequences, as it reduces heat flow and, consequently, the rate of heat dissipation. As a result, the device may overheat, causing reduced performance or device failure.

Different approaches have been attempted to overcome this problem by using backside encapsulation of the TAB leads. One approach for backside encapsulation of the TAB leads uses materials similar to a solder mask for the encapsulation. This approach has many problems. First, the flow of solder mask is difficult to control and accurate dispensing of the material has been found to be not repeatable. Another problem involves the high CTE (coefficient of thermal expansion) and elastic modulus mismatch of the solder mask material and the polyimide film used in the TAB component to hold the leads coming out of the TAB device. The polyimide film warps significantly after the solder mask cures, mainly due to the bi-metallic strip effect of materials with different expansion rates. Due to excessive warpage of the polyimide film after encapsulant cure, the automated component placement machines can not inspect or find the leads during the placement process (since the component warpage is more than the depth of focus of the camera), making the components non-manufacturable.

Another approach uses material similar to the die encapsulation material for backside encapsulation of the die leads. This approach shows the same polyimide warpage as in the case of solder mask material discussed above. Accordingly, it inhibits accurate lead placement by the automated component placement machines.

Therefore, there is a need in the industry for a method of preventing electrical shorting of die leads during installation of a TAB device on a circuit board.

SUMMARY OF THE INVENTION

A tape automated bonding (TAB) device, having plurality of leads and a first material layer with a known coefficient of thermal expansion disposed on a first surface of the leads in order to hold the position of said leads, is installed on a circuit board after applying a second material layer having a coefficient of thermal expansion within a predetermined range of the coefficient of thermal expansion of said first material layer to a second surface of the leads. A layer of conductive die attach material is applied to the circuit board and the die is attached to the layer of die attach material.

The present invention provides significant advantages over the prior art. Because the leads of the TAB device are protected by the second material layer, a die attach layer can be disposed over the entire surface of the die, without danger of the die attach layer migrating up the sides of the die and shorting the leads of the TAB device. Because the CTE of the second material layer is within a desired range of the first material layer, typically a polyimide, problems with warping caused by CTE mismatch can be avoided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

The present invention is best understood in relation to FIGS. 1–6 of the drawings, like numerals being used for like elements of the various drawings.

Figure 1A:
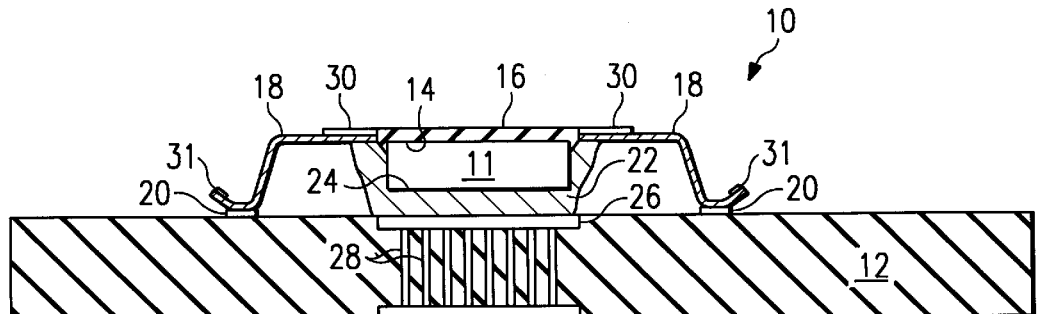
FIG. 1a illustrates a cross-section side view of a prior art TAB device coupled to a circuit board in which a conductive die attach layer has caused shorting between device leads.
Figure 1B:
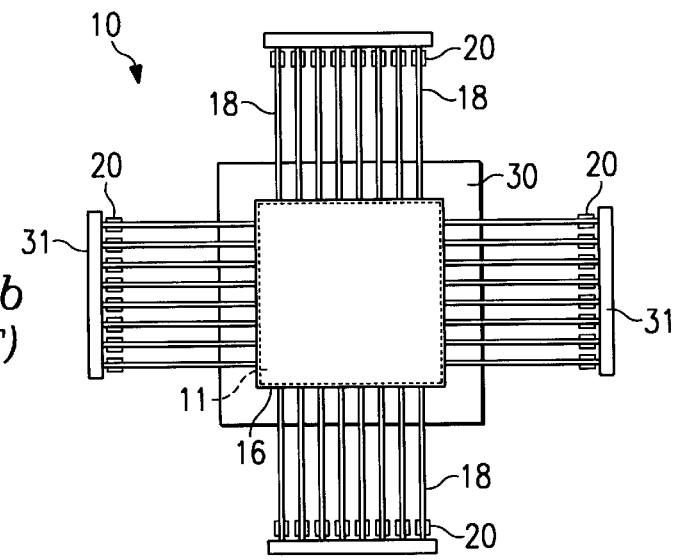
FIG. 1b illustrates a top view of the device of FIG. 1a coupled to the circuit board.
Figure 1C:
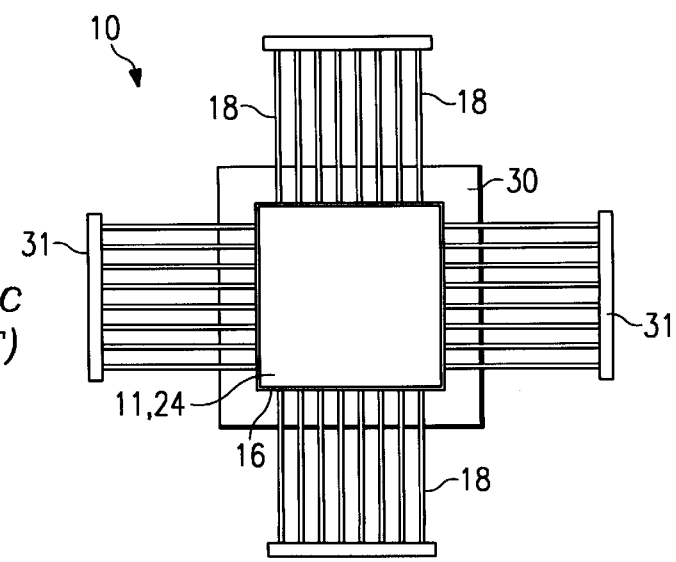
FIG. 1c illustrates a bottom view of the TAB device of FIG. 1a prior to attachment to a circuit board.

FIGS. 1a–d illustrate a serious problem concerning the installation of a TAB device on a circuit board. FIG. 1a illustrates a cross-sectional side view of a TAB device 10 attached to a circuit board 12. FIG. 1b illustrates a top view of the device 10 and FIG. 1c illustrates a bottom view of device 10. The integrated circuit of device 10 is embodied in die 11 which has an outward-pointing (from the circuit board 12) surface 14 which is covered by die encapsulant 16. Leads 18, which are wired to the die 11, extend from the die 11 and are bent during installation to attach to respective pads 20 on board 12. Die attach layer 22 is disposed between the inward-pointing surface 24 of die 11 and a die attach bond pad 26 of the circuit board 12. Typically, the die attach bond pad 26 is coupled to thermal vias 28 which are coupled to a heat sink (not shown). The outward pointing surfaces of exposed leads 18 are covered in the area proximate the die 11 by a polyimide material layer 30. The polyimide material layer 30 maintains the spacing of the leads 18 during installation of the device 10 onto the circuit board 12. A second polyimide layer, the keeper bar 31, is disposed at the ends of the excised leads 18.

Die attach materials come in different forms, such as paste and pre-forms. There are many ways of attaching the die attach material to the back of the die. The most popular process attaches the die attach material to the circuit board 12 using heat, followed by attaching the TAB component 10, using either a formed lead or no form process, described above. The assembly is then cured under pressure at a high temperature, typically between 100° Centigrade and 150° Centigrade, depending upon the choice of die attach material.

In the case of silver-filled paste material, the paste is first dispensed on the board followed by the TAB component placement. The placement pressure for the TAB component spreads the paste material on the board. Placement of the TAB component is followed by a heat cure.

A third process is called the "solvent" process. In this process, the die attach material is attached to the board using a solvent, which dissolves the polymer in the die attach material which then attaches the die attach layer to the board, followed by a second spray on the top of the pre-formed die attach layer prior to TAB component attach. The placement pressure for the TAB component makes the die attach material adhere to the die 11 as well as to the board 12. The excess solvent is driven off by heating the assembly in a cure oven for a short period (such as 10 minutes at 90° C.).

In all the processes outlined above, the silver in the die attach material tends to wick up the die edges, climbing up the sides of the die 11 and shorting the inner leads 18.

FIG. 1a shows the migration of the die attach material 22 towards the leads 18 during the installation process. If the die attach material is conductive, which is necessary if the die attach layer 22 is to form an electrical connection between the die 11 and the circuit board 12, any die attach material which spans two or more leads will cause a short between the leads 18, resulting in device failure. TAB components are not easy to repair, so inadvertent shorting of the leads results in a high volume of rejects and scrap costs.

Figure 1D:
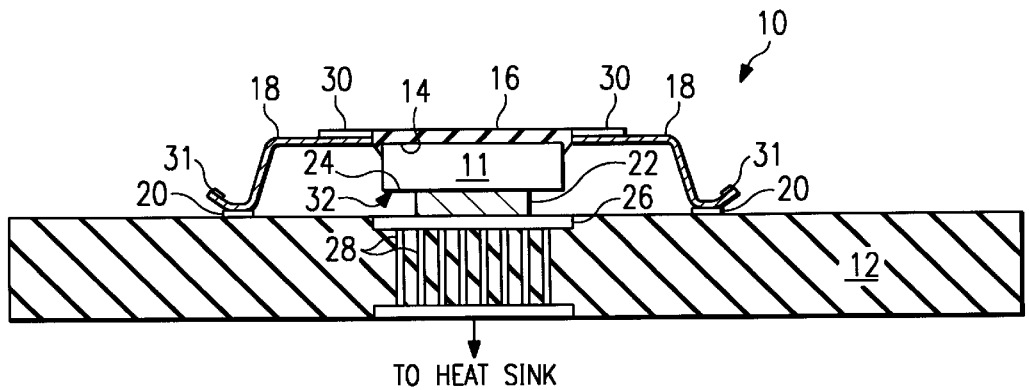
FIG. 1d illustrates a cross-sectional side view of a prior art TAB device coupled to a circuit board using a reduced area die attach layer to prevent lead shorting.

FIG. 1d illustrates a cross-sectional side view of the device 10 attached to the circuit board 12 using a smaller area of die attach layer 22 in order to prevent migration of the die attach material to the leads. As can be seen in FIG. 1d, the die attach layer 22 is smaller than that of FIG. 1a in order to leave a buffer zone 32 on all edges of the die 11.

Unfortunately, reducing the area of the die attach layer 22 reduces the heat flow area between the die 11 and the vias 28. This causes a reduced heat flow from the die during operation, which may be insufficient to dissipate heat. Consequently, the integrated circuit associated with die 11 may suffer reduced performance or failure.

Figure 2A:
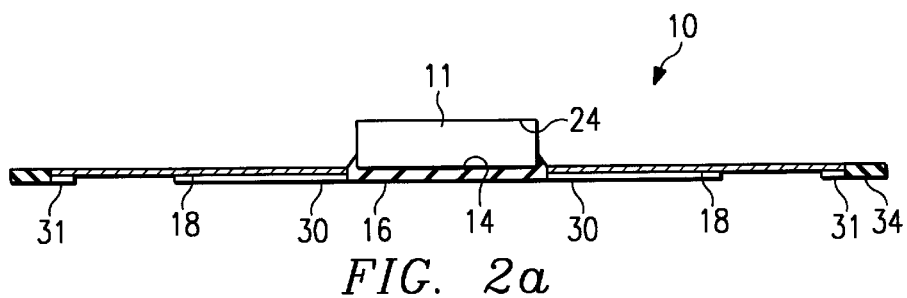
FIG. 2a illustrates a cross-sectional side view of a TAB device mounted in a carrier prior to backside encapsulation of the leads.
Figure 2B:
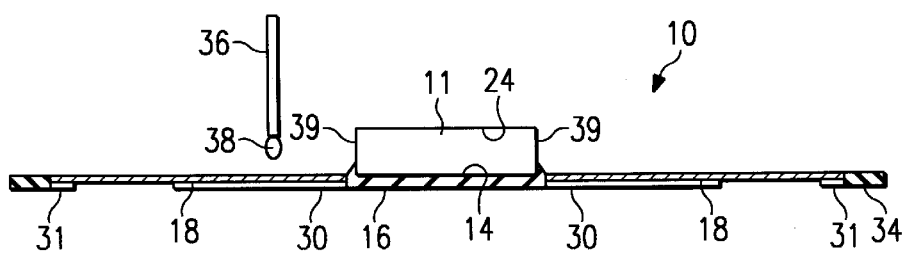
FIG. 2b illustrates a cross-sectional side view of the TAB device of FIG. 2a as encapsulant is applied to the backside of the leads to prevent shorting.

FIGS. 2a–b illustrate cross sectional views of a TAB device 10 undergoing a process to prevent shorting of device leads 18 during attachment of the component to the circuit board 12. FIG. 2a illustrates a cross-sectional side view of the device 10 of FIGS. 1a–d, prior to installation and prior to a backside encapsulation procedure to be described hereinbelow. In this state, a carrier 34 is attached to the device 10. The procedure described hereinbelow can be performed either on devices 10 in carriers 34, as shown in FIG. 2a, or on multiple devices 10 in reel format.

FIG. 2b illustrates the deposit of an encapsulating material on the backside (the side opposite the polyimide material layer 30) of the leads 18 in order to protect the leads 18 during attachment of the device 10 to the circuit board 12. The backside encapsulation procedure described herein can be performed using an automatic liquid dispensing machine; such machines are available from ASYMTEK AUTOMATED FLUID DISPENSING and CAMELOT.

In FIG. 2b, a nozzle 36 of the automatic fluid dispensing machine is shown applying the encapsulation material (encapsulant) 38 to the device 10 on the backside of leads 18. With the inward pointing surface of the die pointing upwards, the encapsulant flows up the sidewall 39 of the die 11 and between the leads 18 to completely encapsulate the underside of the leads 18 (see FIG. 5). The encapsulant is dispensed to flow to each sidewall 39 of the die 11 in order to form a complete seal.

Figure 3:
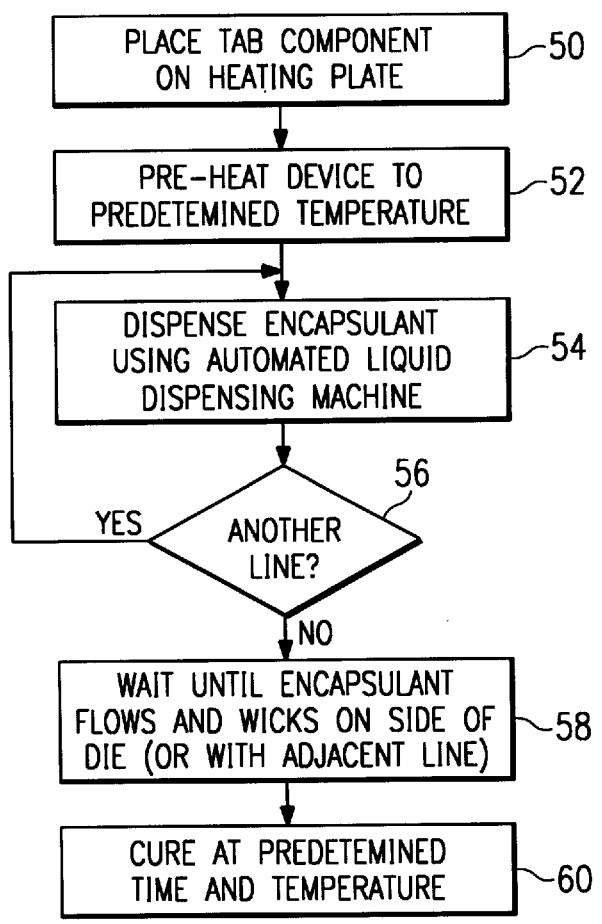
FIG. 3 illustrates a flow chart describing a preferred embodiment for the backside encapsulation procedure.
Figure 4:
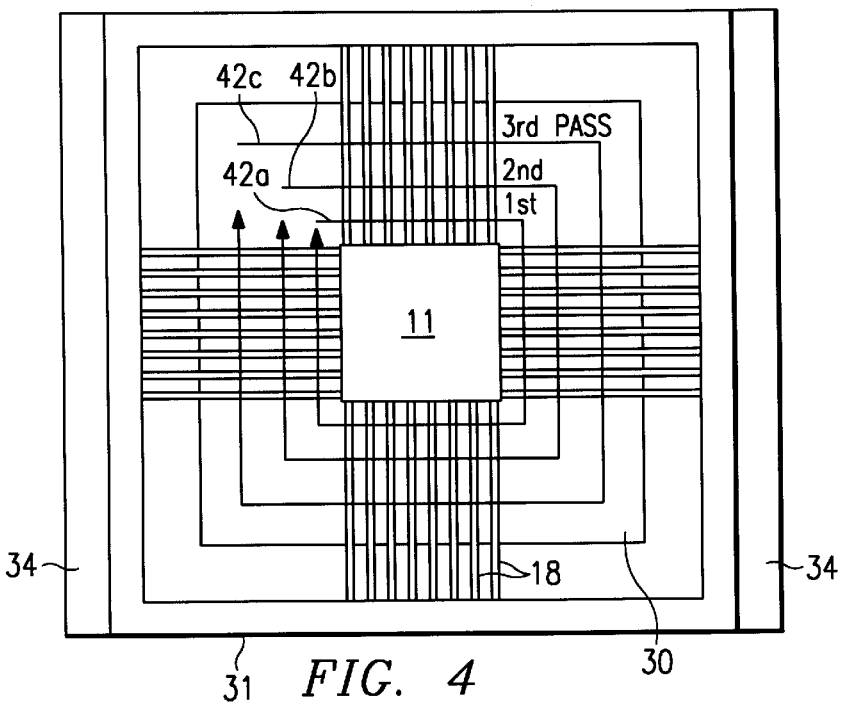
FIG. 4 illustrates a multi-pass process for encapsulating the backside of a TAB device.

FIG. 3 illustrates a flow chart for performing the backside encapsulation of a device. In block 50, the TAB device 10 is placed on the heating plate of the automatic liquid dispensing machine. In block 52, the device 10 is pre-heated to a predetermined temperature, typically between 50° C. and 110° C. A base line temperature would be 70° C., it being understood that higher or lower temperatures could be used to alter the viscosity, and thus the flow characteristics, of the encapsulant as it is applied in order to achieve desired coverage.

In block 54, the encapsulant is dispensed through nozzle 36 of the automatic liquid dispensing machine. In the preferred embodiment, the encapsulant is applied in a plurality of passes around the perimeter of the die 11, as shown in greater detail in FIG. 4 by lines 42a–c. As an example, for a die size of 400×365 mils, consecutive passes could be made at 40 mils (line 42a), 80 mils (line 42b) and 120 mils (line 42c) from the edge of the die 11. The amount dispensed on each pass in this example would be 20 mg, 15 mg and 20 mg for complete coverage. The tip of nozzle 36 is assumed to be vertically displaced from the plane of leads 18 by a distance of 20 mils.

After the passes are complete (block 56), the automatic liquid dispensing machine pauses for a predetermined amount of time to allow the encapsulant from each pass to flow (block 58). This allows the encapsulant from each line to flow together and to wick up the sidewalls of the die 11. After the lines of encapsulant have joined, the component is taken off the heater.

In actual operation, many factors would determine the number of passes, the position of the passes relative to the die, and the amount of encapsulant applied. For example, by applying a greater amount of encapsulant on each pass, the number of passes could be reduced in some cases. Similarly, reducing the amount of encapsulant applied on each pass would increase the number of passes. The temperature of the encapsulant would vary its flow characteristics, affecting the amount dispensed and the waiting period.

In block 60, the encapsulant is cured at a predetermined temperature for a predetermined duration. For the example set forth above, the cure period would be approximately 1.5 hours at a temperature of 150° C.

The procedure described in FIG. 3 can be used either while multiple components are still on a tape, or after individual components are singulated from the tape.

In example described above, an epoxy-based polymer filled with silica is used as the encapsulant. The silica reduces the CTE of the epoxy to a level which matches the CTE of the polyimide within a desired range to prevent excessive warping. One such epoxy is sold as HYSOL 4511, sold by DEXTER ELECTRONICS CORP. HYSOL 4511 is normally used as an underfill material for flip-chips. The material properties of HYSOL 4511 are set forth below:

Formulation: silica filled epoxy color: blue-black silica filler content: 67–72% viscosity @ 25° C.: 13000 centipoise

CTE: 18 to $22 \times 10^{-6}$ per °C. (cured)

Tg: 150° C.

Specific gravity: 1.8

The viscosity of HYSOL 4511 (and other silica filled epoxy materials) decreases as the material is heated and allows the material to flow to the sidewalls 39 of the die 11 and between the leads 18 under capillary action. This is important because the leads must be completely covered by the encapsulant in order to protect them from the die attach material.

Whatever encapsulant is used should have certain properties to be effective. First, it must adhere to the leads 18 and die. Second, as it is dispensed, it should be liquid, and should cure to a solid. In order to prevent any gaps or voids, the encapsulant should flow by capillary action into the grooves between the leads 18 while in a liquid state.

In the preferred embodiment, the flow of the encapsulant should be controllable. For example, the flow characteristics of HYSOL 4511 can be modified by heating; i.e., the viscosity of HYSOL 4511 can be controlled by heating, such that the encapsulant flows faster or further. It is expected that underfill materials other than HYSOL 4511 will work for the backside encapsulant material; however, some may not have flow characteristics which are adequately controllable.

One of the most important characteristics of the encapsulant is that its CTE must be close enough to the CTE of the polyimide layer to avoid excessive warpage upon cure of the encapsulant. The CTE of the encapsulant does not have to exactly match the CTE of the polyimide, so long as the resultant warpage does not cause displacement of the leads outside of their intended bonding pads 20. In the preferred embodiment, the CTE of the encapsulant should be approximately +/−30% of the CTE of the polyimide. A encapsulant CTE in the range of 15 to $22 \times 10^{-6}$ per °C. is proper for a polyimide having a CTE of near $17 \times 10^{-6}$ per °C. For example, the CTE of cured HYSOL 4511 is 18 to $22 \times 10^{-6}$ per °C., while the CTE of the polyimide is approximately $17 \times 10^{-6}$ per °C. HYSOL 4511 has been found to be an effective encapsulant.

By increasing the amount of silica in the epoxy-based polymer, the CTE can be further reduced for more closely matching the CTE of the polyimide. Increasing the silica content, however, will change the flow characteristics of the mixture. Accordingly, it is not necessary to have an exact CTE match insofar as any warping will not affect device placement on the circuit board.

Additionally, the encapsulant should not be sensitive to moisture or react to any solvent being used to process the die attach material for attachment to the die 11.

Figure 5:
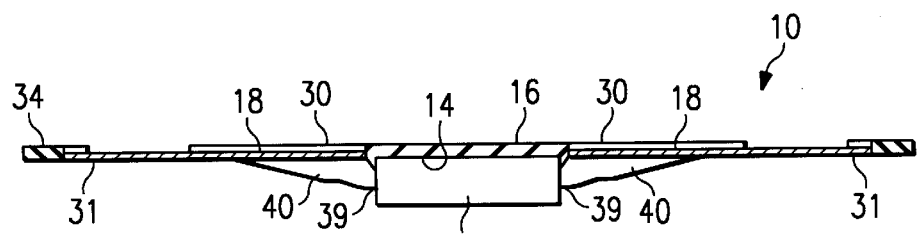
FIG. 5 illustrates a cross-sectional side view of a TAB device after backside encapsulation.

FIG. 5 illustrates a cross-sectional side view of a TAB device 10 after the backside encapsulation procedure described in connection with FIG. 3. The backside encapsulation region 40 extends around all four sides of the die 11, completely sealing the inner portion of the leads 18, particularly the region between leads. The encapsulation region 40 extends outward from the die 11 by a distance sufficient to protect the leads from migration of the die attach layer 22. For the example given above, it has been found that a 150 mil distance is more than sufficient to protect the leads. A greater distance may be warranted where the die size, and hence the area of the die attach layer, is greater.

After performing the backside encapsulation of the dies 11, the dies 11 can be placed in the automated component placement machine for attaching the dies to boards. Prior to component placement, the leads are excised, leaving a small band of the polyimide layer 31 on the end of the leads. The devices can then be attached using the methods described above, as are known in the prior art.

Figure 6:
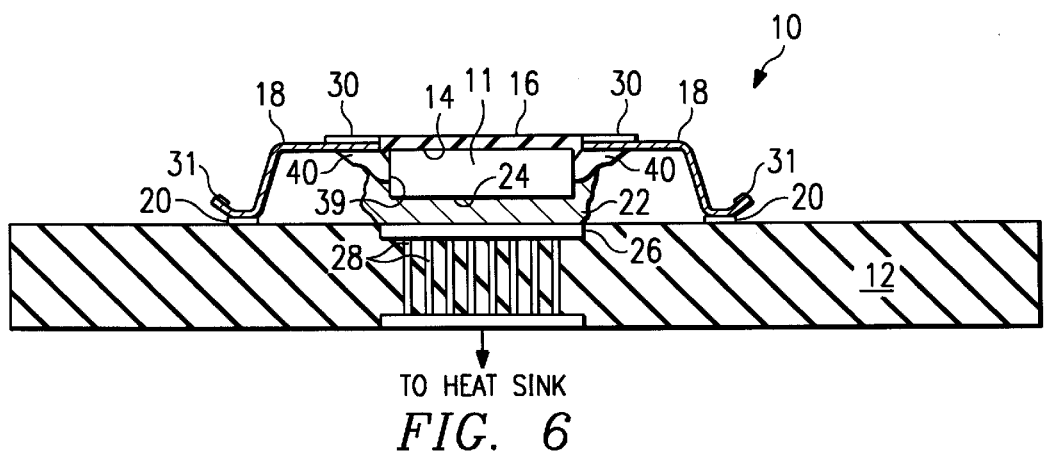
FIG. 6 illustrates a cross-section side view of a TAB device with backside encapsulation attached to a circuit board with a full-sized die attach layer.

FIG. 6 illustrates a cross-sectional diagram of a device 10 as shown in FIG. 5, after attachment onto the circuit board 12. The die attach layer 22 spreads during the die attach procedure, causing the die attach material to migrate up the sides 39 of the die 11. As opposed to the prior art, the die attach material is separated from the leads by the backside encapsulation region 40, which is dielectric. Accordingly, the die attach layer cannot cause a short between leads, which would result in device failure.

Importantly, the die attach layer 22 can be sized to completely cover the inward pointing surface 24 of the die, such that heat transfer between the die 11 and the heat sink is maximized. The portion of the die attach material which migrates up the die contacts the backside encapsulation region, rather than the leads 18. This ensures that the device 10 will not suffer performance degradation due to overheating caused by a restricted path for heat flow, such as the path shown in connection with FIG. 1*d*.

The present invention provides significant advantages over the prior art. First, the backside encapsulation is performed without excessive warpage to the leads 18, by matching the CTE of the backside encapsulant with the material formed over the leads, typically a polyimide material. Second, the die attach layer formed under the leads is sized for full coverage of the inward surface of the die 11, promoting maximum heat transfer.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A method of installing a semiconductor device on a circuit board, comprising the steps of:

applying a first material layer having a known coefficient of thermal expansion to a first surface of leads directly connected to said semiconductor device in order to maintain the positioning of the leads, said first surface directed away from the circuit board;

applying a second material layer having a coefficient of thermal expansion within a predetermined range of the coefficient of thermal expansion of said first material layer to a second surface of the leads, said second material layer is also deposited on at least a portion of a side surface of said semiconductor device, said second surface directed towards said circuit board; and applying a layer of conductive die attach material to the circuit board;

attaching the die to the layer of die attach material.

2. The method of claim 1 wherein said step of applying a first material layer comprises the step of applying a polyimide material to said first surface of the leads.

3. The method of claim 2 wherein said step of applying a second material layer comprises the step of applying a polymer adhesive material to said second surface of said leads.

4. The method of claim 3 wherein said step of applying a polymer adhesive material comprises the step of applying a mixture of epoxy and silica particles to said second surface of said leads.

5. The method of claim 4 wherein said step of applying a mixture of epoxy and silica particles comprises the step of applying a mixture of polymers and silica particles having a coefficient of thermal expansion of 15 to $22 \times 10^{-6}$ per °C.

6. The method of claim 5 and further comprising the step of heating said first material layer prior to said step of applying said second material layer.

7. The method of claim 6 and wherein said heating step comprises the step of heating said first material layer to 50°–110° C.

8. The method of claim 1 wherein said step of applying a layer of conductive die attach material comprises the step of applying a layer of die attach material having an area approximately equal to the area of the die.

9. A method of installing a tape automated bonding (TAB) device to a circuit board, said TAB device having a die directly connected to a plurality of leads, with a first material layer having a known coefficient of thermal expansion disposed on a first surface of the leads in order to hold the position of said leads, said first surface directed away from the circuit board, comprising the steps of:

applying a layer of a second material having a coefficient of thermal expansion within a predetermined range of the coefficient of thermal expansion of said first material layer to a second surface of the leads, said second material layer is also deposited on at least a portion of a side surface of said semiconductor device, said second surface directed towards said circuit board;

applying a layer of conductive die attach material to the circuit board; and attaching the die to the layer of die attach material.

10. The method of claim 9 wherein said second material comprises an adhesive.

11. The method of claim 10 and further comprising the step of curing the second material layer prior to said step of attaching the die to the layer of die attach material.

12. The method of claim 9 wherein the step of applying a second material layer comprises the steps of:

applying one or more lines of said second material;

pausing for said one or more lines of said second material to flow.

13. The method of claim 12 wherein said pausing step comprises the step of pausing for said one or more lines of said second material to flow by capillary action.

14. The method of claim 9 wherein said first material layer comprises a polyimide material layer and said second material layer comprises an epoxy material filled with silica.

15. The method of claim 1, further including the step of connecting at least some of said leads to conductive pads on said circuit board.

16. The method of claim 9, further including the step of connecting at least some of said leads to conductive pads on said circuit board.

17. A method of preparing a semiconductor device for subsequent installation on a circuit board, comprising the steps of:

applying a first material layer having a known coefficient of thermal expansion to a first surface of leads directly connected to said semiconductor device in order to maintain the positioning of the leads, said first surface directed away from the semiconductor device;

applying a second material layer having a coefficient of thermal expansion within a predetermined range of the coefficient of thermal expansion of said first material layer to a second surface of the leads, said second material layer is also deposited on at least a portion of a side surface of said semiconductor device; and applying a layer of conductive die attach material to the circuit board; and attaching the die to the layer of die attach material.

* * * * *